United States Patent [19]

Lampman et al.

[11] Patent Number: 4,983,920
[45] Date of Patent: Jan. 8, 1991

[54] NMR SPECTROSCOPY WITH PHASE ENCODING WITHIN A SELECTED VOXEL

[75] Inventors: David A. Lampman, Lakewood; Martyn N. J. Paley, Mayfield Village; James M. McNally, Chagrin Falls, all of Ohio

[73] Assignee: Picker International, Inc., Highland Hts., Ohio

[21] Appl. No.: 392,480

[22] Filed: Aug. 11, 1989

[51] Int. Cl.$^5$ .................................................. G01R 33/20
[52] U.S. Cl. ........................................................ 324/309
[58] Field of Search ............... 324/300, 307, 309, 310, 324/311, 312, 313, 314, 306; 128/653 AF

[56] References Cited

U.S. PATENT DOCUMENTS

| | | | |
|---|---|---|---|
| 4,599,565 | 7/1986 | Hoenninger | 324/309 |
| 4,602,641 | 7/1986 | Feinberg | 324/306 |
| 4,604,579 | 8/1986 | Cannon et al. | 324/309 |
| 4,712,066 | 12/1987 | Luyten et al. | 324/309 |
| 4,771,242 | 9/1988 | Lampman et al. | 324/309 |
| 4,818,937 | 4/1989 | Ailion et al. | 324/309 |

OTHER PUBLICATIONS

Peter R. Luyten et al., NMR Spectroscopy of the Human Brain by Spatial Localization and Imaging Techniques, pg. 327.
T. Richards, et al., Phase Encoded Proton Spectroscopy and Imaging of the Rat Brain in Vivo with the Surface Coil, 1984, pp. 621–622.

Primary Examiner—Michael J. Tokar
Attorney, Agent, or Firm—Fay, Sharpe, Beall, Fagan, Minnich & McKee

[57] ABSTRACT

Magnetic resonance is excited in first selected dipoles and suppressed in second selected dipoles in an examination region (10) by the application of a binomial 90° pulse (40). The induced resonance is phase encoded along at least two axes by phase encode gradients (42, 44). Concurrently, an RF refocussing pulse (54) and a slice select gradient pulse (56) are applied. Analogous pulse pairs (68, 70; 72, 74) are applied once with the slice select gradient along each of three mutual orthogonal axes such that a voxel or volume defined by the intersection of the three slices is defined. A magnetic resonance echo (84) is allowed to form, which echo is attributable to the resonating dipoles within the defined voxel. The phase encoding gradients have divided the voxel into subvoxels along the respective axes. The resultant magnetic resonance echo signals are Fourier transformed (92) into sets of chemical spectra corresponding to each subvoxel and displayed in a two dimensional image representation on a video monitor (96).

20 Claims, 2 Drawing Sheets

NMR SPECTROSCOPY WITH PHASE ENCODING WITHIN A SELECTED VOXEL

BACKGROUND OF THE INVENTION

The present invention relates to the art of magnetic resonance spectroscopy. It finds particular application in conjunction with in-vivo examinations and will be described with particular reference thereto. However, it is to be appreciated that the invention may find further application in conjunction with the spectroscopic examination of localized regions for imaging, chemical shift analysis, and the like.

When examining a complex structure, such as a region of a human patient, there are numerous different chemical compounds within the magnetic resonance examination region. To isolate a small volume of the region of interest, or voxel, two techniques are commonly employed—phase encoding techniques and voxel localization techniques. In phase encoding techniques, phase encoding gradients are applied across the sample such that phase can be used to obtain spatial encoding. In voxel localization, the signal is only recovered from a small volumetric element, or voxel.

More specifically, phase encoding techniques typically provide spatial definition over a region whose size is defined by the sensitive volume of the receiver coil. Because this sensitive volume is determined by the receiver coil geometry, it is substantially fixed from study to study. There is little latitude for defining or adjusting the region over which phase encoding occurs. This presents difficulties for spectroscopy because no allowance is made for avoiding regions of large magnetic field inhomogeneities, such as the boundaries between materials with different susceptibilities. These field inhomogeneities degrade water suppression and spatial resolution. Also, it is often desirable to avoid certain regions of the sample. For example, if fat layers are included in the sensitive volume, they can obscure the spectra due to "leakage" of the point-spread function between neighboring voxels. Fat signals are also much larger than the metabolites commonly of interest. Thus, the fat signals can degrade the dynamic range required to detect low concentrations of metabolites.

Voxel localization techniques, such as the technique described in U.S. Pat. No. 4,771,242, recover the signal only from a small voxel in the sample. To map or measure chemical concentrations over an extended region, a plurality of single voxel experiments are conducted. In each repetition, the voxel is defined at a different location within the sample. Although this technique is accurate, it tends to be time consuming.

In another voxel localization technique described in "In Vivo 1H NMR Spectroscopy of the Human Brain by Spatial Localization and Imaging Techniques", by P. Luyten, et al., SMRM Book of Abstracts, page 327 (1988), a volume is selected with refocused stimulated echoes. This volume selection technique utilizes a series of 90° refocusing pulses. Phase encoding for one or two dimensional spectroscopic imaging is combined with the volume selection in order to suppress unwanted lipid signals from surrounding tissues. Although this technique enables subvoxels to be defined in the voxel, the Luyten technique has several drawbacks. First, the 90° refocussing pulses only recover half the signal—the other half is lost. Further, spoiler gradient pulses for dephasing spurious echoes must be primarily the same polarity. Unlike opposite polarity spoiler pulses which provide for cancellation of gradient eddy currents, the unipolar spoiler pulses tend to promote eddy current degradation of the linewidths.

The present invention contemplates a new and improved spectroscopy technique which overcomes the above referenced problems and others.

SUMMARY OF THE INVENTION

In accordance with the present invention, a method of phase encoding localized magnetic resonance spectroscopy is provided. A binomial 90° excitation pulse is applied to excite resonance at certain frequencies without exciting resonance at other frequencies. Magnetic field gradients and radio frequency pulses are applied to manipulate the nuclei such that only nuclei within a selected volumetric element contribute to a recovered magnetic resonance signal. The applied magnetic field gradients include phase encoding gradients along one, two, or three axes such that the magnetic resonance signal is phase encoded relative to at least one spatial dimension of the volumetric element. The procedure is repeated with a plurality of phase encoding gradient steps.

In accordance with a more limited aspect of the present invention, bipolar spoiler magnetic field gradients are applied to dephase spurious echoes.

In accordance with another aspect of the present invention, an apparatus is provided including means for performing each of the foregoing steps.

One advantage of the present invention is that it improves the signal-to-noise ratio.

Another advantage of the present invention is that it optimizes field homogeneity. The size of the region of interest is selectively restrictable which avoids regions that have components that may degrade the dynamic range or introduce unwanted peaks.

Another advantage of the present invention is that it provides greater flexibility in defining spatial resolution. Aliasing signals from outside of the region of interest can be eliminated.

A further advantage of the present invention is that it reduces eddy current signal degradation. Antisymmetric spoiler pulses provide for self-cancellation of eddy currents.

Yet another advantage of the present invention is that it produces metabolic maps over a selected region. The region of interest is subdivided by phase encoding to define a plurality of subvoxels.

Another advantage is that sub-voxels may be added to improve signal-to-noise ratio over defined regions.

Still further advantages of the present invention will become apparent to those of ordinary skill in the art upon reading and understanding the following detailed description of the preferred embodiment.

BRIEF DESCRIPTION OF THE DRAWINGS

The invention may take form in various steps or arrangements of steps and in various components or arrangements of components. The drawings are only for purposes of illustrating a preferred embodiment and are not to be construed as limiting the invention.

DETAILED DESCRIPTION OF THE PREFERRED EMBODIMENT

Figure 1:
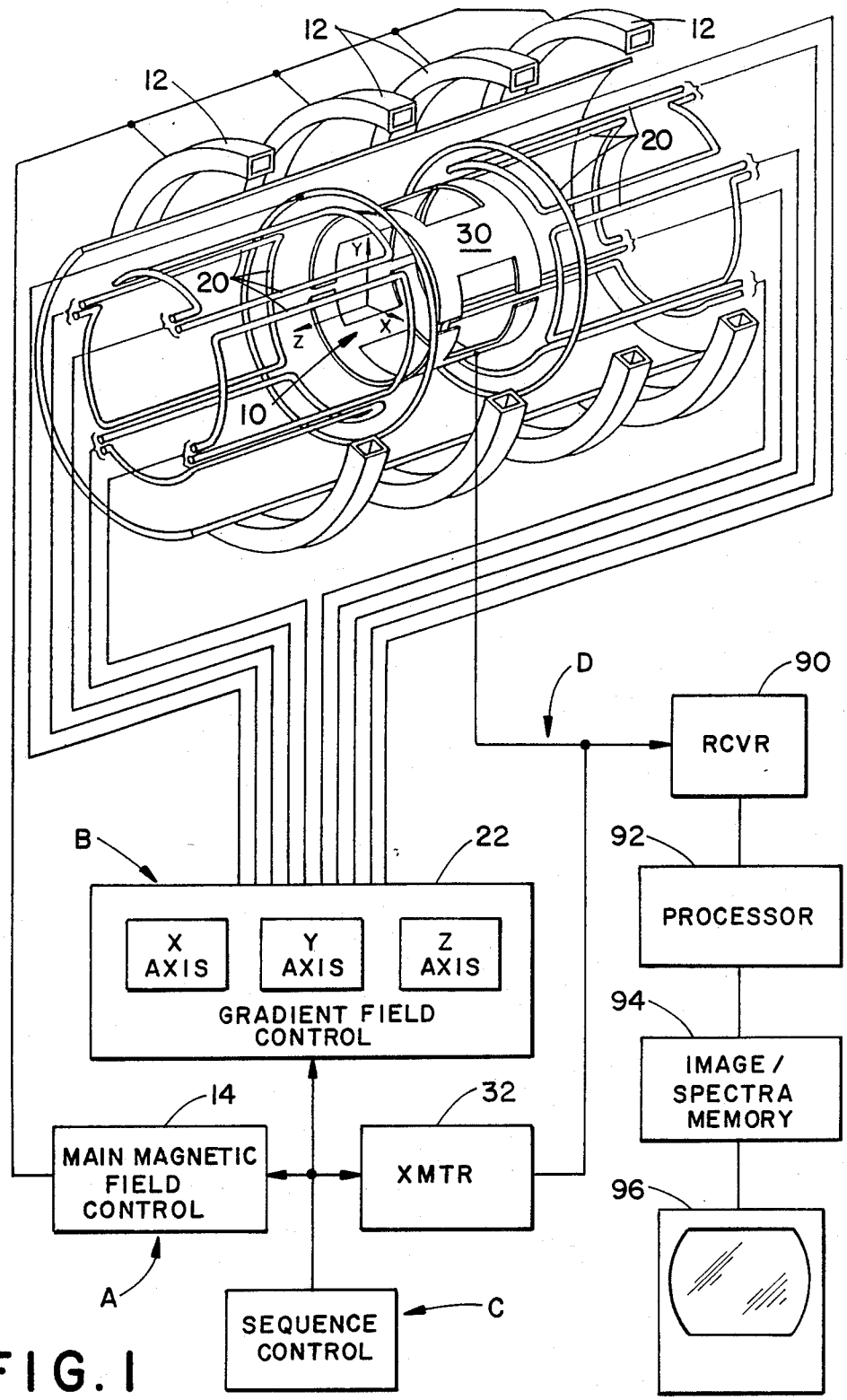
FIG. 1 is a diagrammatic illustration of a magnetic resonance spectroscopy apparatus in accordance with the present invention; and, FIG. 2 is a diagrammatic illustration of a radio frequency and magnetic field gradient pulse sequence applied by the apparatus of FIG. 1 to collect spectral data.

With reference to FIG. 1, a main magnetic field means A generates a substantially uniform, main magnetic field through an examination region 10. The main magnetic field causes a preferential alignment of the magnetization of nuclei, such as the protons in hydrogen nuclei, within the examination region. The main magnetic field means includes a plurality of annular magnets 12, such as resistive or superconducting magnets, and a main field control means 14. The main magnetic field means may also include various shimming structures and coils, as are known in the art, for improving the uniformity of the main magnetic field.

A gradient magnetic field means B selectively causes magnetic field gradients across the main magnetic field in the examination region. In the preferred embodiment, the gradients are caused along three orthogonal axes, commonly denoted x, y, and z. The magnetic field is generated by a plurality of gradient coils 20 that are controlled by a gradient control means or circuit 22. The gradient control means applies current pulses to the gradient coils of the appropriate magnitude, duration, and periodicity to cause the gradient magnetic field pulses denoted in FIG. 2. Each applied gradient varies linearly across the examination region 10 and defines a corresponding continuum of planar regions thereacross, each with a unique magnetic field strength. The rate of change or steepness of the gradient is controlled by the amplitude or strength of the corresponding magnetic field gradient pulse. The gradient control B under control of a sequence controller C applies slice-selecting, phase encoding, and/or spoiler pulses on each of the x,y, or z gradients.

A radio frequency means D transmits radio frequency signals into the examination region. More particularly, a radio frequency coil 30 surrounds the patient or subject portion in the examination region. A radio frequency transmitter 32 sends appropriate current pulses to the radio frequency coil to cause binomial 90° radio frequency pulses, 180° magnetization refocusing pulses, and the like. More specifically, the sequence controller C includes a means for generating a $1\bar{3}3\bar{1}$ 90° binomial excitation pulse and a refocusing pulse means for generating 180° refocusing pulses.

The resonance frequency for a given nuclei is proportional to the product of its gyromagnetic ratio and the strength of the surrounding magnetic field. The binomial excitation pulse includes bands of frequencies relative to the surrounding magnetic field strength which are excited and bands of frequencies which are suppressed. The frequency bands of the binomial pulse are selected relative to the main magnetic field and the gyromagnetic ratio of the nuclei such that resonance is selectively excited at frequencies of interest and suppressed in other selected frequencies. The excited and suppressed nuclei can both be the same atom, such as hydrogen, but bound to surrounding atoms in different ways. The chemical bonding sufficiently affects the resonance frequency that, for example, hydrogen atoms in water or brain tissue can be distinguished from hydrogen atoms in fat, or hydrogen atoms in certain metabolites.

When the refocusing pulses are applied in the presence of a magnetic field gradient, the surrounding magnetic field is the sum of the gradient and the main magnetic fields. Accordingly, the 180° refocusing pulses have a range or spectrum of frequencies which refocus the magnetization of the resonating nuclei in only a limited region. The width or size of the limited region along the gradient direction is determined by the strength of the magnetic field gradient and the frequency bandwidth of the refocusing pulse. For simplicity, it is preferred that the 180° pulse generator generate a fixed frequency bandwidth refocusing pulse and that the slice select gradient field control means 22 apply a slice select gradient of selectable magnitude. The magnitude of the slice select gradient is then adjusted in order to select the width of the defined region or voxel. The voxel can be shifted by applying an offset to the transmitted frequency during each of the slice selecting 180° pulses.

Figure 2:
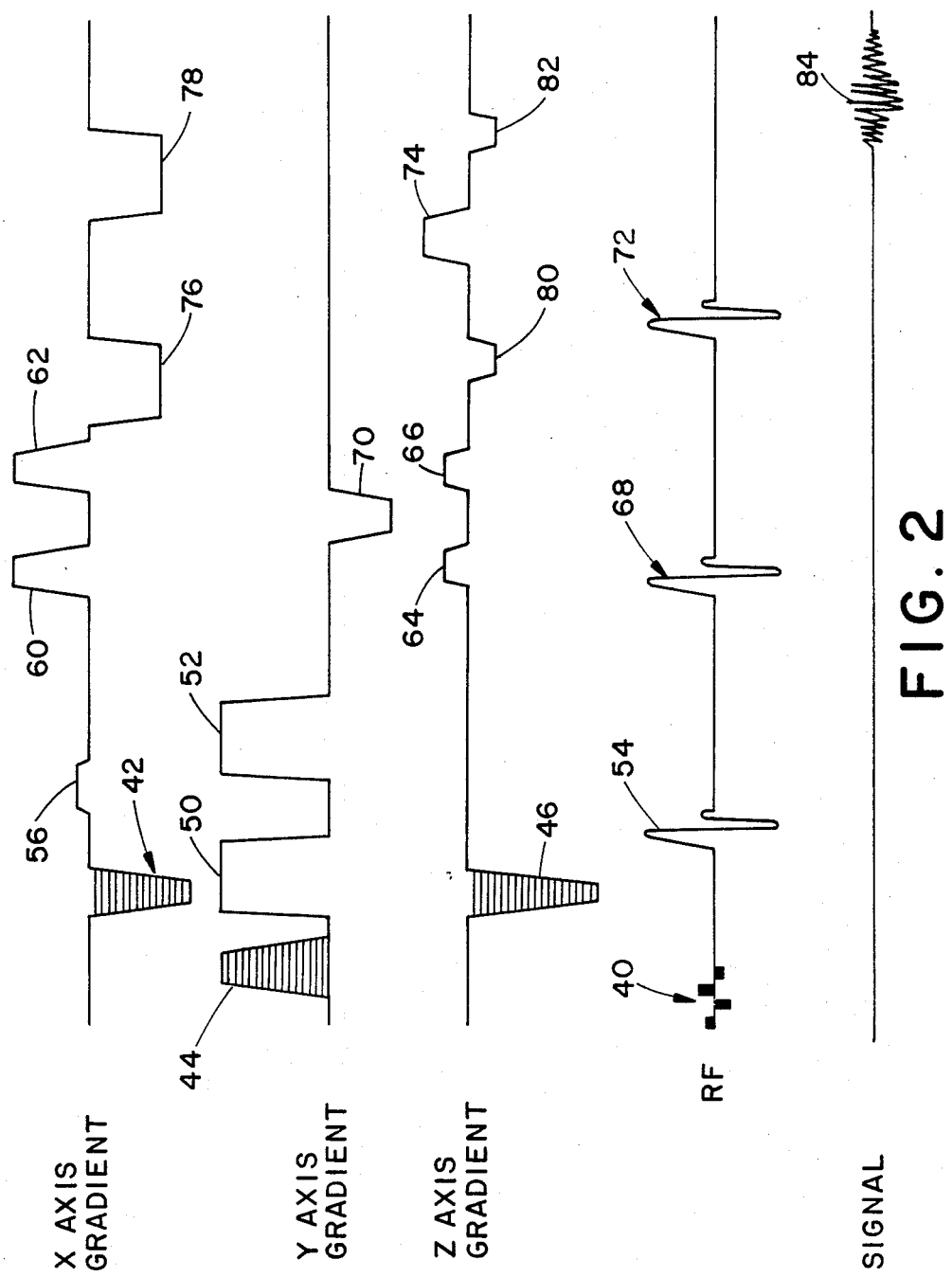

A sequence control means D controls the gradient and radio frequency means in accordance with the sequence of FIG. 2. The binomial pulse generating means selectively excites resonance of the nuclei of interest and suppresses other selected nuclei within the examination region by applying a binomial 90° excitation pulse 40, such as a $1\bar{3}3\bar{1}$ pulse. The numerals of the pulse designation indicate the relative pulse length at constant height or height of constant length and the bars indicate the polarity. Once the selected nuclei are excited to resonance, phase encoding gradient pulses 42, 44 and 46 are applied along the axes which are to be subdivided.

Spoiler gradients 50, 52 are applied symmetrically to either side of a concurrently applied refocusing pulse 54 and slice select gradient 56. In the illustrated embodiment, the x axis slice select gradient is relatively small, i.e. not very steep. This causes a relatively wide slice or slab to be defined along the x axis. The x phase encoding gradient enables this relatively large dimension to be subdivided.

Spoiler pulses 60 and 62 along the x axis and spoiler pulses 64 and 66 along the z axis are applied symmetrically to either side of a concurrently applied 180° refocusing pulse 68 and a y axis slice select gradient 70. This selectively refocuses the magnetization within a rectangular continuum defined at the intersection of the x axis slice and the y axis slice.

The first refocusing pulse 54 causes the magnetization vectors within the x axis slice to commence rephasing while those outside of the slice continue to dephase. Normally, the rephasing magnetizations would come completely back into phase, creating a first spin echo.

The second refocusing pulse 68 is applied after the first refocusing pulse 54. The second pulse refocuses the magnetization of nuclei in the region at the intersection of the x and y gradient planes toward a spin echo. The second refocusing pulse refocuses the magnetization in the y axis defined planar region causing it to rephase toward a spin echo. The magnetizations lying in the second planar region, which are not in the first planar region, have been dephasing since the excitation pulse 40. However, the magnetization vectors which were first refocused by the first refocusing pulse 54 and were subsequently refocused by the second refocusing pulse 68 will refocus into an echo. Thus, the magnetization of nuclei in the region of intersection between the first and second slices refocuses toward a spin echo at a different time from other nuclei in the examination region and are readily segregated.

The volume of interest is further defined by applying a third refocusing pulse 72 concurrently with a z gradient slice select pulse 74. The magnitude of the slice select gradient 74 again determines the width of the slice or slab within which the magnetizations are refocused. Spoiler pulses 76, 78 are applied along the x axis and spoiler pulses 80, 82 applied along the z axis are applied to either side of the third slice select pulse. Again, the third refocusing pulse refocuses the magnetization of all the nuclei within the third or z axis slice. The magnetization from within the volume produces a spin echo 84 at a different time from magnetization outside of the voxel defined by the intersection of the three slices. A radio frequency receiver 90 receives the resultant radio frequency spin echo signal data.

The phase encoded gradient 42 causes a phase encoding along the x axis and the phase encoding gradient 46 causes an analogous phase encoding along the z axis. These two encoded phases enable relative position along the x and z axis to be resolved. The x and z phase encodings each vary in steps in accordance with the steps applied by the phase encode gradients 42, 46 in subsequent repetitions. When the phase encode gradient 44 is applied along the y axis, the magnetic resonance echo signals can be resolved along all three dimensions. Analogously, the phase encoding may be limited to one direction leaving the other two directions limited by the respective slice widths or voxel dimensions.

In addition, oblique voxels may be contained by defining slice select and phase encoding pulses simultaneously on more than one axis such that the vector sum of the gradient pulses defines a voxel that is oriented oblique to the physical gradient axes.

The effective spatial resolution is controlled by changing the amplitude and/or number of phase encoding steps which change the size and/or number of subvoxels. The dimensionality of the sub-voxels is determined by the number of axes along which phase encoding is performed.

A processor 92 Fourier transforms the resulting data to provide a set of chemical shift spectra where each spectrum represents the chemical composition of a subvoxel centered at a particular point in space. The effective spatial resolution and signal-to-noise can also be manipulated by adjusting the size of the Fourier transform, e.g. by zero-padding, as is known in the art, or by combining the signal from adjacent sub-voxels in order to increase the signal-to-noise. The resultant spectra are stored in an image spectra memory means 94.

The spectra may be displayed on a video monitor 96 in a two dimensional array in order to visualize the distribution of chemical compounds over a region of space. Each element in the array may be a single value, indicative of a color, two values - one to be displayed as color or hue and the other to control intensity, or the like. The values are based on a spectral analysis performed by the processor. The analysis preferably generates values, a color or hue value, which substance(s) are present in the sub-voxel, and an intensity value, which is indicative of the concentration of the substance(s), or the like. In this manner, a "map" is generated of the sample, showing the distribution of chemicals within the sample.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A method of magnetic resonance spectroscopy comprising:
   selectively exciting resonance of selected dipoles within an examination region;
   applying a series of concurrent radio frequency refocusing pulses and slice select pulses, the slice select pulses being applied along a plurality of axes, such that each concurrent refocusing pulse and slice select gradient pulse manipulate resonance within a corresponding slice, such that resonance of dipoles within a voxel defined by an intersection of the slices contribute to a resultant spin echo substantially to the exclusion of nuclei outside of the voxel;
   applying a phase encode gradient along at least one gradient axis, such that the defined voxel is phase encoded into subvoxels along such axis;
   segregating data from the resultant spin echoes in accordance with the phase encoding such that echo data corresponding to each subvoxel is separated;
   spectrally analyzing data from individual subvoxel;
   concurrently displaying spectral analysis data from a plurality of the subvoxels.

2. The method as set forth in claim 1 wherein the phase encoding step includes phase encoding along at least two gradient axes such that the voxel is divided into a two dimensional array of subvoxels.

3. The method as set forth in claim 2 wherein the displaying step includes displaying a two dimensional array of values, the array corresponding to the two dimensional array of subvoxels and the pixel values being indicative of derived spectral analysis data from each subvoxel.

4. The method as set forth in claim further including applying a plurality of bipolar spoiler gradient pulses for dephasing spurious echoes.

5. A method of localized magnetic resonance spectroscopy comprising:
   applying a binomial excitation pulse to excite resonance of a first selected nuclei and suppress resonance of second selected nuclei;
   applying phase encoding gradients along at least one axes;
   concurrently applying radio frequency refocusing and slice select gradient pulses along each of a plurality of axes, each concurrent radio frequency refocusing pulse and slice select gradient pulse manipulating the resonance of nuclei within a slice that intersects the corresponding slice select gradient axes, such that a resultant magnetic resonance signal from the first selected nuclei within a voxel defined by an intersection of the slices is separable from resonance signals attributable to nuclei outside of the voxel, the voxel being divided into subvoxels along at least one direction by the phase encoding gradients;
   segregating magnetic resonance signal components attributable to each subvoxel in accordance with the phase encoding gradients.

6. The method as set forth in claim 5 further including applying a plurality of bipolar spoiler gradient pulses.

7. The method as set forth in claim 5 further including applying phase encoding gradients along a second axis such that the voxel is divided by the phase encoding gradients into subvoxels in two dimensions.

8. The method as set forth in claim 7 further including applying phase encoding gradients along a third axis such that the voxel is divided by the phase encoding gradients into subvoxels in three dimensions.

9. The method as set forth in claim 7 further including generating a man-readable two dimensional display in accordance with the magnetic resonance signal from each of a two dimensional array of the subvoxels.

10. The method as set forth in claim 9 further including spectrally analyzing the magnetic resonance data from each subvoxel for chemical properties of resonating nuclei within each subvoxel.

11. The method as set forth in claim 10 wherein the displaying step includes displaying a selectively variable color tone and a selectively variable intensity at each region of the two dimensional display in accordance with the spectral analysis of the corresponding subvoxel magnetic resonance signal component.

12. A method of magnetic resonance comprising:
selectively exciting magnetic resonance at selected frequencies within an examination region and suppressing magnetic resonance at other selected frequencies within the examination region;
phase encoding the excited magnetic resonance along at least one axis;
applying gradient magnetic field pulses and RF pulses to manipulate excited resonance such that only nuclei within a selected volumetric element contribute to a resultant magnetic resonance echo, which selected volumetric element is divisible into subvoxels at least along the first axis by the phase encoding;
during the application of gradient magnetic field pulses and RF pulses, applying a plurality of bipolar spoiler gradient pulses for dephasing spurious echoes.

13. The method as set forth in claim 12 wherein the phase encoding step includes further phase encoding the resonance along a second axis such that the volumetric element is phase encoded along at least two dimensions.

14. The method as set forth in claim 13 further including:
receiving magnetic resonance data from each magnetic resonance echo; and,
segregating received magnetic resonance echo data into data attributable to each subvoxel.

15. The method as set forth in claim 12 wherein the step of applying gradient field pulses and RF pulses includes concurrently applying an RF refocussing pulse and a slice select pulse along each of a plurality of axes.

16. The method as set forth in claim 15 wherein the spoiler pulses are applied symmetrically to either side of the RF pulses and with opposite polarity for subsequent RF pulses.

17. A magnetic resonance spectroscopy apparatus comprising:
a means for creating a static magnetic field through an examination region;
a magnetic field gradient means for selectively applying magnetic field gradient pulses across the examination region;
a radio frequency means for selectively applying radio frequency pulses for (i) exciting magnetic resonance of selected nuclei in the examination region and (ii) for manipulating the excited resonance;
a control means for controlling the gradient field means and the RF means such that nuclei within a selected volume contribute to a resultant magnetic resonance echo, substantially to the exclusion of dipoles outside of said volume;
the gradient field means selectively phase encoding the excited resonance along at least one axis to divide the volume into subvolumes;
a receiver means for receiving the resultant magnetic resonance echo;
a processor means for Fourier transforming magnetic resonance signals attributable to sets of chemical shift spectra and chemically analyzing the chemical spectra set for each subvolume; and,
a display means for providing a two dimensional display of analyzed spectral sets.

18. The apparatus as set forth in claim 17 further including a spectrum memory means for storing magnetic resonance echo data in accordance with the subvolume from which it originated.

19. The apparatus as set forth in claim 17 wherein the gradient means further includes means for applying bipolar spoiler gradient pulses for dephasing spurious echoes.

20. A magnetic resonance apparatus comprising:
means for creating a static magnetic field through an examination region;
a radio frequency means for selectively (i) exciting magnetic resonance at selected frequencies within an examination region and suppressing magnetic resonance at other selected frequencies and (ii) for manipulating the excited resonance;
a gradient field means for selectively applying magnetic field gradient pulses across the examination region for (i) phase encoding the excited resonance and (ii) for interacting with the radio frequency resonance manipulation pulses for limiting magnetic resonance to a selected volume which is divisible into subvoxels in accordance with the phase encoding gradients and (iii) for applying bipolar pairs of spoiler gradient pulses for dephasing spurious echoes.

* * * * *